US012568816B2

(12) United States Patent
Choi et al.

(10) Patent No.: US 12,568,816 B2
(45) Date of Patent: Mar. 3, 2026

(54) THREE-DIMENSIONAL SEMICONDUCTOR INTEGRATED CIRCUIT DEVICE INCLUDING INTER-DIE INTERFACE

(71) Applicant: SAMSUNG ELECTRONICS CO., LTD., Suwon-si (KR)

(72) Inventors: Jae Seung Choi, Suwon-si (KR); Byung-Su Kim, Suwon-si (KR); Bong Il Park, Suwon-si (KR); Chang Seok Kwak, Suwon-si (KR); Sun Hee Park, Suwon-si (KR); Sang Joon Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 18/227,113

(22) Filed: Jul. 27, 2023

(65) Prior Publication Data

US 2024/0120276 A1     Apr. 11, 2024

(30) Foreign Application Priority Data

Oct. 11, 2022     (KR) ........................ 10-2022-0129845

(51) Int. Cl.
| | |
|---|---|
| *H01L 23/528* | (2006.01) |
| *H01L 23/498* | (2006.01) |
| *H01L 23/522* | (2006.01) |
| *H10D 88/00* | (2025.01) |

(52) U.S. Cl.
CPC .... *H01L 23/5283* (2013.01); *H01L 23/49816* (2013.01); *H01L 23/5226* (2013.01); *H10D 88/00* (2025.01)

(58) Field of Classification Search
CPC ........... H01L 23/5283; H01L 23/49816; H01L 23/5226; H10D 88/00
USPC .......................................................... 257/678
See application file for complete search history.

(56) References Cited

U.S. PATENT DOCUMENTS

| | | | |
|---|---|---|---|
| 8,330,489 | B2 | 12/2012 | Bartley et al. |
| 8,392,870 | B2 | 3/2013 | Zhang et al. |
| 8,775,998 | B2 | 7/2014 | Morimoto et al. |
| 9,679,840 | B2 | 6/2017 | Chuang et al. |
| 10,002,865 | B2 | 6/2018 | Or-Bach et al. |
| 10,346,574 | B2 * | 7/2019 | Arimilli .................. G06F 30/39 |
| 10,599,806 | B2 | 3/2020 | Xu et al. |
| 2022/0037307 | A1 | 2/2022 | Lee |

* cited by examiner

*Primary Examiner* — Tu-Tu V Ho
(74) *Attorney, Agent, or Firm* — Sughrue Mion, PLLC

(57) ABSTRACT

A three-dimensional semiconductor integrated circuit device including an inter-die interface is provided. The device includes a top die including a plurality of micro cells provided on a top surface of the top die, a plurality of micro bumps provided on a bottom surface of the top die, and wiring patterns connecting the plurality of micro cells to the plurality of micro bumps; and a bottom die including a plurality of macro cells provided on a top surface thereof, wherein the plurality of macro cells are electrically connected to the plurality of micro bumps, respectively, wherein a size of a region in which the plurality of micro cells are provided is smaller than a size of a region in which the plurality of micro bumps are provided.

20 Claims, 8 Drawing Sheets

110

300

R1

115

240

R3

400

210

Y

X

Z

THREE-DIMENSIONAL SEMICONDUCTOR INTEGRATED CIRCUIT DEVICE INCLUDING INTER-DIE INTERFACE

CROSS-REFERENCE TO RELATED APPLICATION

This application claims priority from Korean Patent Application No. 10-2022-0129845 filed on Oct. 11, 2022 in the Korean Intellectual Property Office, the contents of which is incorporated by reference herein in its entirety.

BACKGROUND

1. Field

Example embodiments relate to a semiconductor device, and more specifically, to a three-dimensional semiconductor integrated circuit device including an inter-die interface.

2. Description of Related Art

A System In Package (SIP) may include a plurality of semiconductor devices, which are mounted into a single package. In order to reduce an area in the package occupied by the semiconductor devices, and to achieve high-speed communication between the semiconductor devices, there is a need to develop a three-dimensional semiconductor integrated circuit in which the plurality of semiconductor devices are vertically stacked using a Through Silicon Via (TSV).

A three-dimensional semiconductor integrated circuit in which the plurality of semiconductor devices are vertically stacked may occupy a smaller area. However, from a design point of view, there is a difficulty in arranging the devices and wirings for integration of the devices into a multilayer stack.

SUMMARY

One or more example embodiments may provide a three-dimensional semiconductor integrated circuit in which an inter-die interface implemented as a template pattern is provided with a simplified inter-layer interconnection while reducing the design complexity of each layer.

One or more example embodiments may provide a three-dimensional semiconductor integrated circuit with an inter-die interface that reduces design complexity without wasting a top die area.

Embodiments of the present disclosure are not limited to the one or more example embodiments mentioned above. Other purposes and advantages according to one or more example embodiments that are not mentioned may be understood based on following descriptions, and may be more clearly understood by the following description of one or more example embodiments. Further, it will be easily understood that the purposes and advantages according to the one or more example embodiments may be realized.

According to an aspect of one or more example embodiments, a three-dimensional semiconductor integrated circuit device includes: a top die including: a plurality of micro cells provided on first side of the top die; a plurality of micro bumps provided on second side of the top die; and wiring patterns connecting the plurality of micro cells to the plurality of micro bumps; and a bottom die including a plurality of macro cells provided on first side of the bottom die, wherein the plurality of macro cells are electrically connected to the plurality of micro bumps, and wherein a size of a region comprising the plurality of micro cells is smaller than a size of a region comprising the plurality of micro bumps.

According to an aspect of one or more example embodiments, a three-dimensional semiconductor integrated circuit device includes: a bottom die; a top die stacked vertically on the bottom die; and a template pattern configured as an interface for transmitting and receiving a signal between the top die and the bottom die, wherein the top die includes micro bumps provided on a bottom surface of the top die, and micro cells provided on a top surface of the top die, and the micro bumps and the micro cells are respectively connected to each other via a wiring pattern in a tree structure manner.

According to an aspect of one or more example embodiments, a three-dimensional semiconductor integrated circuit device includes: a top die including: a top-connection region including a plurality of micro cells on a top surface of the top die; a lower-connection region including a plurality of micro bumps on a bottom surface of the top die; and a wiring pattern connecting the plurality of micro cells to the plurality of micro bumps; and a bottom die stacked under the top die, wherein the bottom die includes a bottom-connection region including a plurality of macro cells on a top surface of the bottom die, and wherein a size of the top-connection region is smaller than a size of the lower-connection region.

BRIEF DESCRIPTION OF DRAWINGS

The above and other aspects and features of the present disclosure will become more apparent by describing in detail example embodiments thereof with reference to the attached drawings, in which.

DETAILED DESCRIPTION

For convenience of description of one or more example embodiments, three-dimensional directions are expressed using an X-axis, a Y-axis, and a Z-axis. However, the illustrated directions are relative, and one or more example embodiments are not limited thereto. The three-dimensional directions may be expressed using the Z-axis, the Y-axis, and the X-axis or using the X-axis, the Z axis and the Y axis.

However, hereinafter, an example in which the three-dimensional directions are expressed using the X-axis, the Y-axis, and the Z-axis will be described.

Terms such as "first" and "second" may be used to describe various components of one or more example embodiments, but the components are not limited by the terms. These terms may be used for the purpose of distinguishing one component from another.

Figure 1:
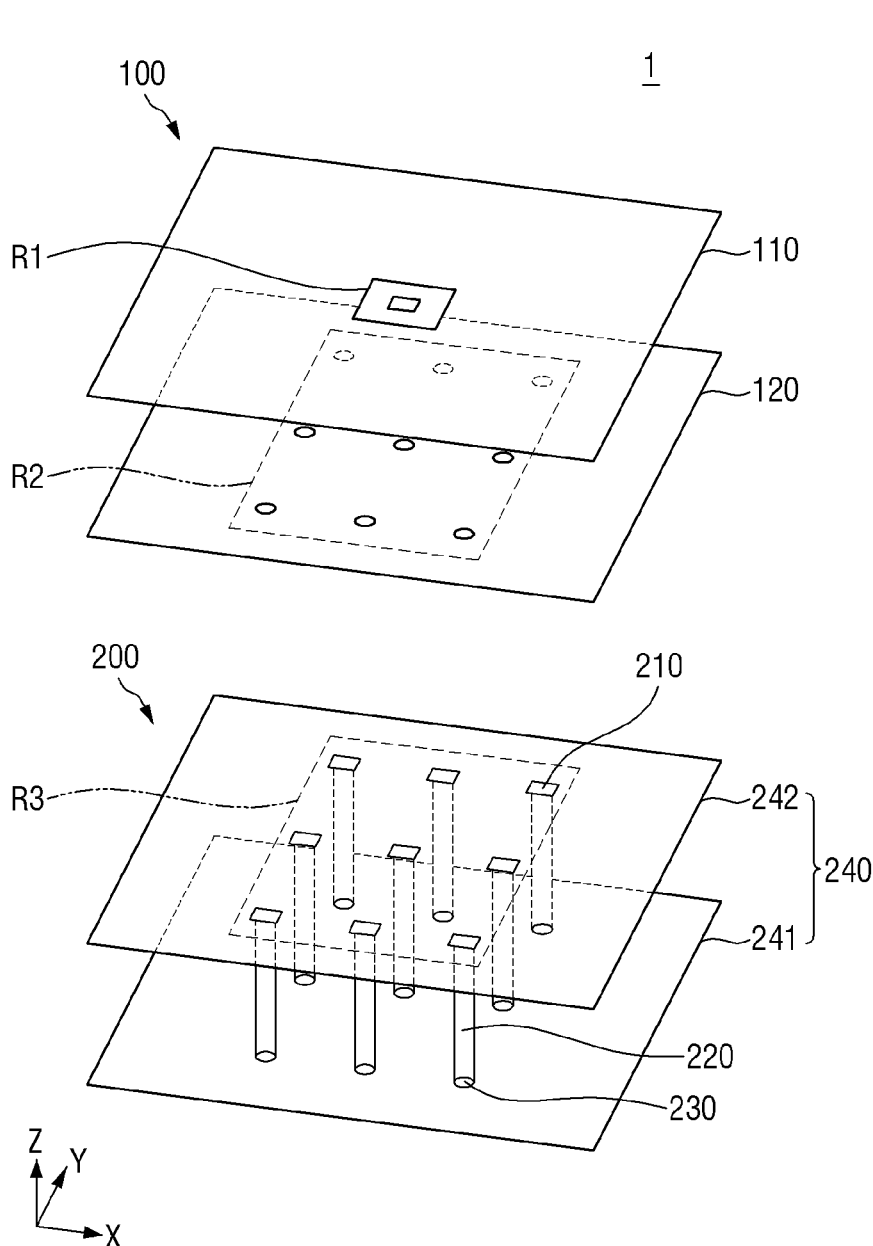
FIG. 1 shows a perspective view of a three-dimensional semiconductor integrated circuit according to one or more example embodiments.
Figure 2:
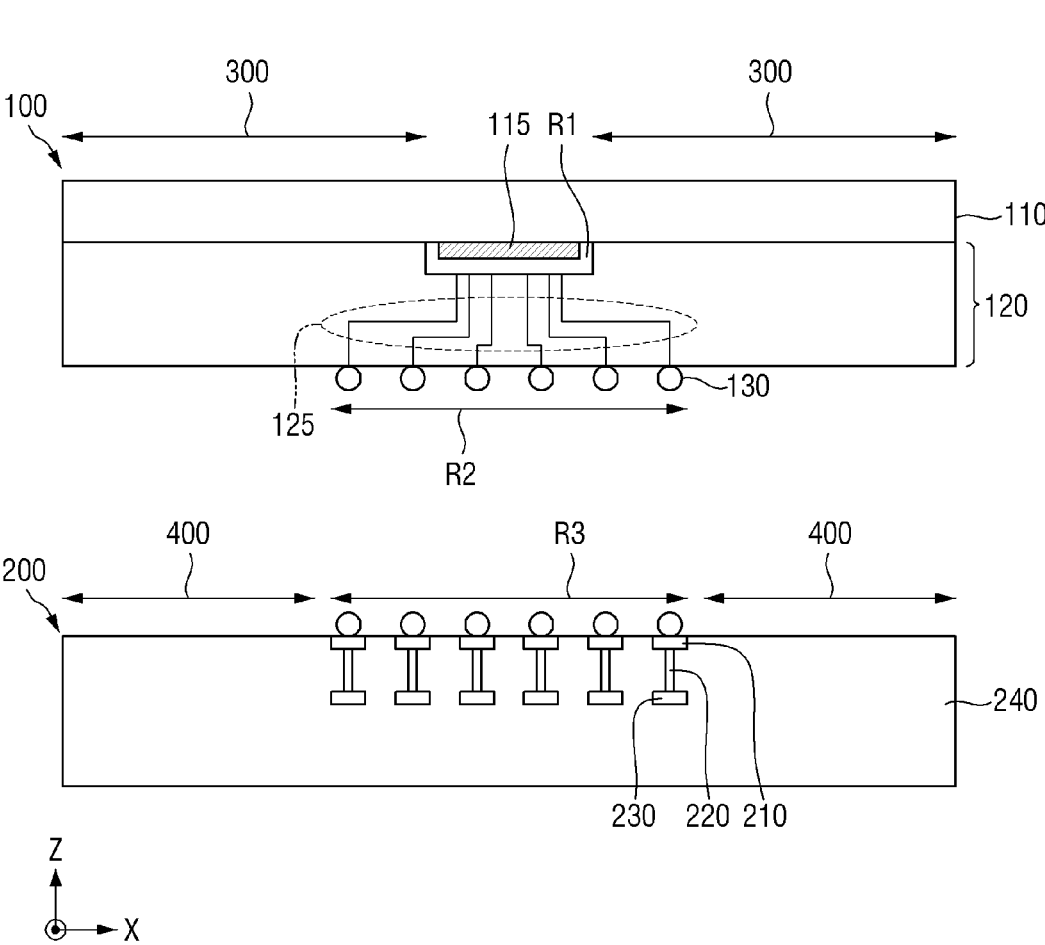
FIG. 2 shows a cross-sectional view of a three-dimensional semiconductor integrated circuit according to one or more example embodiments.

FIG. 1 shows a perspective view of a three-dimensional semiconductor integrated circuit according to one or more example embodiments, and FIG. 2 shows a cross-sectional view of a three-dimensional semiconductor integrated circuit according to one or more example embodiments.

Referring to one or more example embodiments shown in FIG. 1 and FIG. 2, a three-dimensional semiconductor integrated circuit 1 includes a top die 100 and a bottom die 200 which are vertically stacked.

The top die 100 according to one or more example embodiments includes a top-connection region R1 and a lower-connection region R2 constituting a template pattern acting as a die-to-die bus interface. The top die 100 includes the connection regions R1 and R2 at a top surface and a bottom surface thereof respectively. The top surface of the top die 100 includes a logic cell region 300 and the top-connection region R1. The top-connection region R1 may include a plurality of micro cells (115 in FIG. 2). According to one or more example embodiments, the plurality of micro cells 115 may be provided in a tile form and may be provided on a bottom surface of a logic structure 110, that is, a top surface of a lower structure layer 120. Each of the micro cells 115 may be connected to each of the macro cells 210 of the bottom die 200, respectively. The logic cell region 300 may be a remaining region of the top surface of the top die 100 other than the top-connection region R1.

The logic structure layer 110 in which logic cells are provided is provided on a top surface of the top die 100. At least one logic cell may be formed in the logic structure layer 110 and in the logic cell region 300. The logic cell may be a standard cell implementing a logic circuit. The logic cell may be electrically connected to each one of the micro cells 115 of the top-connection region R1 and may transmit/ receive a signal to and from each one of the micro cells 115.

The lower structure layer 120 is provided below the logic structure layer 110. The lower structure layer 120 may include a plurality of wiring patterns 125 and insulating layers formed on a substrate. The wiring patterns 125 may be made of a conductive material, and examples of the conductive material may include, but are not limited to, nickel, copper, gold, solder, etc. The insulating layer may include, but is not limited to, for example, at least one of silicon oxide, silicon nitride, silicon oxynitride, and a low-k material having a dielectric constant lower than that of silicon oxide. However, one or more example embodiments are not limited thereto.

According to one or more example embodiments, the top die 100 may include the lower-connection region R2 at the bottom surface thereof, and the lower-connection region R2 may include a plurality of micro bumps 130. The micro bumps 130 may be attached to a bottom surface of the lower structure layer 120, that is, the bottom surface of the top die 100, and may be electrically connected to the wiring patterns 125 formed in the lower structure layer 120, respectively. The micro bumps 130 may be connected to the macro cells of the bottom die 200. The micro bumps 130 may be made of copper (Cu), aluminum (Al), silver (Ag), tin (Sn), gold (Au), or solder, or similar materials.

According to one or more example embodiments, the micro cells 115 and the micro bumps 130 may be mapped and connected to each other, and the number of the micro cells 115 in the top-connection region R1 may be the same as the number of the micro bumps 130 in the lower-connection region R2. For example, one of the micro bumps 130 may receive a signal output from the bottom die 200, and the one of the micro bumps 130 may transmit the received signal to one of the micro cells 115. Alternatively, the logic cell of the logic cell region 300 may output a transmit signal to one of the micro cells 115, and the one of the micro cells 115 may transmit the transmit signal to the bottom die 200 via one of the micro bumps 130.

According to one or more example embodiments, the micro cells 115 may include at least one re-timer. Because the wiring patterns 125 have various paths depending on a positional relationship between the micro cells 115 and the micro bumps 130, a delay may occur depending on various path lengths. The logic cells of the top die 100 may receive a signal, a delay of which is adjusted to a preset time (or an uniform value) using the re-timer. The re-timer may be implemented, for example, as a storage element such as a register. The number of re-timers corresponding to a length of the signal wiring path may be included in each of the micro cells 115.

That is, a connection structure of the micro cells 115, the wiring patterns 125, and the micro bumps 130 may constitute a template pattern of a baobab tree structure. As used therein, a structure of the template pattern is referred to as the baobab tree structure. However, the scope of one or more example embodiments is not limited thereto. The structure of the template pattern may have a tree structure or a balloon structure or an equivalent formed structure.

According to one or more example embodiments, the template pattern may include a shield structure. That is, the shield structure may separately shield the micro cells 115, the wiring patterns 125, and the micro bumps 130 to prevent crosstalk with another wiring or another metal adjacent thereto for the logic cell in the logic structure layer 120.

According to one or more example embodiments, in the top die 100, the top-connection region R1 may be smaller in size than the lower-connection region R2. Further, according to one or more example embodiments, a spacing (or distance) between adjacent micro cells 115 may be shorter than a spacing between adjacent micro bumps 130.

According to one or more example embodiments, the bottom die 200 includes a bottom-connection region R3 at a top surface 242 thereof. The top surface 242 of the bottom die 200 includes a logic cell region 400 and the bottom-connection region R3. The logic cell region 400 may be a remaining region other than the bottom-connection region R3.

The upper structure layer 240 is provided below the top die 100 in FIG. 1 and FIG. 3. At least one logic cell may be formed in the upper structure layer 240 and in the logic cell region 300. The logic cell may be a standard cell implementing a logic circuit. For example, the upper structure layer 240 of the bottom die 200 may further include a logic cell for supplying power to the three-dimensional semiconductor integrated circuit 1. The logic cell may be electrically connected to each of macro cells 210 of the bottom-connection region R3 and may transmit/receive a signal to/from the top die 100 via each macro cell.

The upper structure layer 240 may include a plurality of wiring patterns 230, Thorough Silicon Vias (TSVs) 220 and an insulating layer formed on a substrate. The wiring patterns may be made of a conductive material, and examples of the conductive material include, but are not limited to, nickel, copper, gold, or solder, etc. The insulating layer may include, but is not limited to, for example, at least one of silicon oxide, silicon nitride, silicon oxynitride, and a low-k material having a dielectric constant lower than that of silicon oxide. However, one or more example embodiments are not limited thereto.

According to one or more example embodiments, the bottom-connection region R3 of the bottom die 200 may have the same area as that of the lower-connection region R2 of the top die 100. The bottom-connection region R3 may include a plurality of macro cells 210. The plurality of macro cells 210 may be provided in various manners. For example, the macro cells may be provided in a manner corresponding to a manner in which the plurality of micro bumps 130 are provided. According to another example, the macro cells may respectively correspond to the micro bumps 130, while positions thereof may not correspond to the positions of the micro bumps 130, depending on a type of a device. Each one of the macro cells 210 may be connected to each one of the micro bumps 130 of the top die 100.

According to one or more example embodiments, the top-connection region R1 may have the same or different area size as that of the lower-connection region R2. Alternatively, according to one or more example embodiments, the top-connection region R1 may have a different arrangement from that of the lower-connection region R2.

For example, the micro cells 115 in the top-connection region R1 may have smaller size than the lower-connection region R2. In addition, the lower-connection region R2 may have the same region size as a size of a region in which the macro cells 210 are provided in the bottom-connection region R3 according to one or more example embodiments. Alternatively, the lower-connection region R2 may have an smaller area size than the size of the region in which the macro cells 210 are provided in the bottom-connection region R3 according to one or more example embodiments.

According to one or more example embodiments, the top-connection region R1 in the top die 100 may be a different area size than the lower connection region R2, while the micro bumps 130 of the lower connection region R2 may have a same manner of arrangement as the macro cells 210 of the bottom connection region R3. Accordingly, the logic cell region 300 may have a larger area size than that of the logic cell region 400.

According to one or more example embodiments, the template pattern including the micro cells 115, the micro bumps 130 and the macro cells 210 may act as a universal bus interface for transmitting and receiving a general-purpose signal between the top die 100 and the bottom die 200. For example, the general-purpose signal may be a power voltage signal, a common control signal, or etc. Alternatively, according to one or more example embodiments, the template pattern including the micro cells 115, the micro bumps 130, and the macro cells 210 may be an interface for a local signal used only between two adjacent dies in the three-dimensional semiconductor integrated circuit. For example, via the template pattern, the local signal may be exchanged only between a first die and a second die. Alternatively, according to one or more example embodiments, the template pattern may be configured as an interface in which some micro bumps 130 transmit/receive the general-purpose signal while the other micro bumps 130 transmit/receive the local signal.

In the three-dimensional semiconductor integrated circuit according to one or more example embodiments, the template pattern for the interface may be first placed on the top die 100 and the bottom die 200 and then, the logic cells may be placed on the top die 100 and the bottom die 200. When the top die is coupled to the bottom die, each logic cell and each one of the micro cells 115 of the top die are connected to each other via the template pattern. Because the interface for the die-to-die connection is templated, there is no need to worry about a wiring connection from another die to the logic cell, but only the connection from the micro cells 115 to the logic cell or the connection from the macro cells 210 thereof is considered. Thus, Place and Routing (PnR) is easier in terms of a design.

The three-dimensional semiconductor integrated circuit according to one or more example embodiments includes the top-connection region R1 and the lower-connection region R2 constituting the template acting as a bus interface in the top die. According to one or more example embodiments, the template acting as the bus interface may simplify the signal connection between the top die 100 and the bottom die 200, and may reduce a region overhead of the top-connection region R1 for the bus interface, so that a design freedom in the top die is improved.

Figure 3:
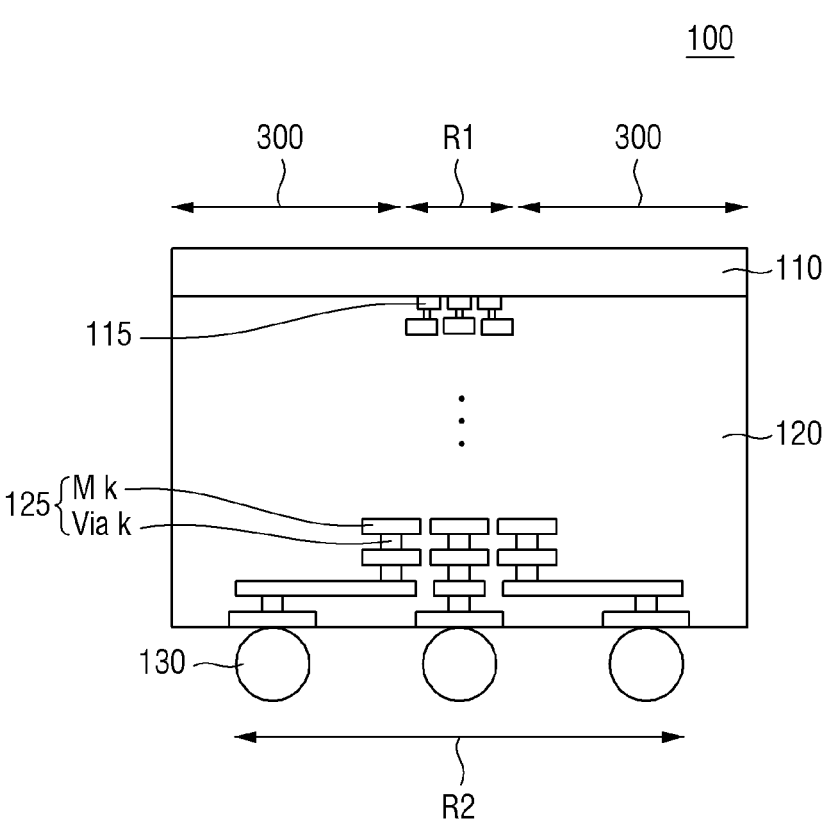
FIG. 3 is a cross-sectional view showing one or more example embodiments of the top die 100 of FIG. 2.

FIG. 3 is a cross-sectional view showing one or more example embodiments of the top die 100 of FIG. 2.

Referring to FIG. 3, the top-connection region R1 is provided at the top surface of the lower structure layer 120 of the top die 100, and the lower-connection region R2 is provided at the bottom surface of the lower structure layer 120 of the top die 100. A plurality of micro cells 115 are provided in the top-connection region R1, and each of the micro cells 115 is connected to each of the micro bumps 130 of the lower-connection region R2 via the wiring patterns 125.

Each of the wiring patterns 125 includes a plurality of vias extending in the Z direction and a plurality of metal wirings M extending in the X or Y direction. Different metal wirings "M k" (k is a natural number) of different layers are connected to each other via a via "Via k."

The micro cells 115, the wiring patterns 125, and the micro bumps 130 of the top die 100 may constitute the template pattern for transmitting and receiving a signal to and from the bottom die 200. That is, the template pattern may include the lower connection region R2, the micro bumps 130, the wiring patterns 125, the top-connection region R1 and the micro cells 115 of the top die 100 in a stacking arrangement.

Figure 4A:
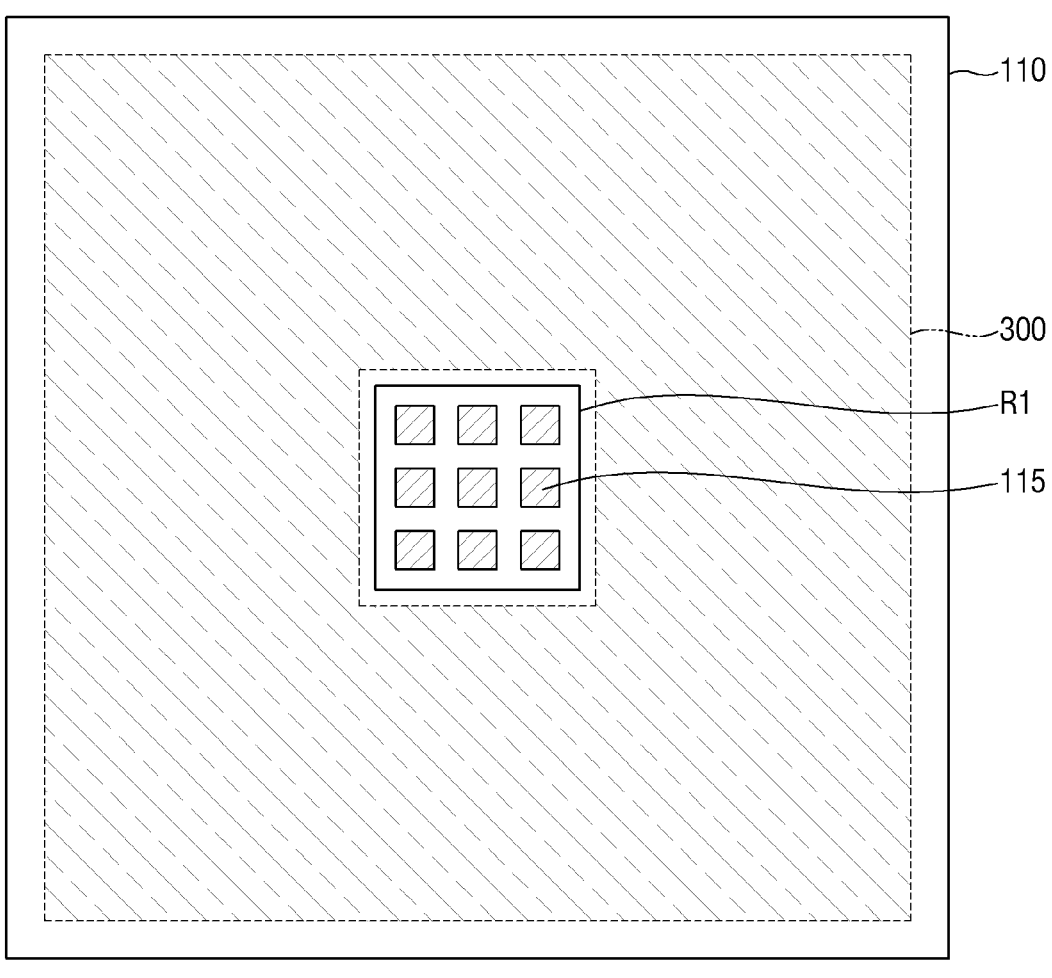
FIG. 4A is a plan view of a top surface of a top die of a three-dimensional semiconductor integrated circuit according to one or more example embodiments.
Figure 4A:
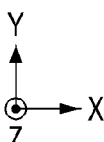

FIG. 4A is a plan view of a top surface of a top die of a three-dimensional semiconductor integrated circuit according to one or more example embodiments.

According to one or more example embodiments, the top-connection region R1 may be provided at any position of the top surface of the top die 100. FIG. 4A illustrates an example in which the top-connection region R1 is located at a center thereof according to one or more example embodiments. Hereinafter, one or more example embodiments of FIG. 4A will be described.

The top-connection region R1 may include the plurality of micro cells 115 provided in rows and columns. Each of the micro cells 115 may independently receive different signals. The micro cells 115 may be provided in a plurality of rows and columns provided in the X and Y directions. According to one or more example embodiments, the micro cells 115 may be spaced apart from each other by a first spacing in a row direction and may be spaced apart from each other by a second spacing in a column direction. According to one or more example embodiments, the first spacing and the second spacing may be equal to each other.

Alternatively, in one or more example embodiments, the micro cells 115 may be grouped such that a first group includes adjacent ones of the micro cells 115 spaced from by a first spacing, a second group includes adjacent ones of the micro cells 115 spaced from by a second spacing. In this case, a template pattern may be constructed such that the first group may be an interface for a general-purpose signal and the second group may be an interface for a local signal.

In one or more example embodiments shown in FIG. 4A, a case in which the micro cells 115 are provided in 3×3 array is described. However, according to one or more example embodiments, the micro cells 115 may be provided in one row or one column. Further, in still one or more example embodiments, the micro cells 115 may be provided in a different form from those as described above. In addition, although one or more example embodiments have been described based on the case in which there are 9 micro cells 115, the number of the micro cells 115 may vary according to one or more example embodiments.

The logic cell region 300 may be a remaining region other than the top-connection region R1. As described with reference to one or more example embodiments shown in FIG. 2 and FIG. 3, the micro cells 115 may be provided on the bottom surface of the logic structure layer 110, while the logic cells are not provided on the top-connection region R1. A wiring pattern for connecting the logic cell to the micro cells 115 may be provided on the top-connection region R1 of the logic structure layer 110.

According to one or more example embodiments, the micro bumps 130 of the lower-connection region R2 may be provided in a row and column arrangement different from an arrangement of the micro cells 115.

Figure 4B:
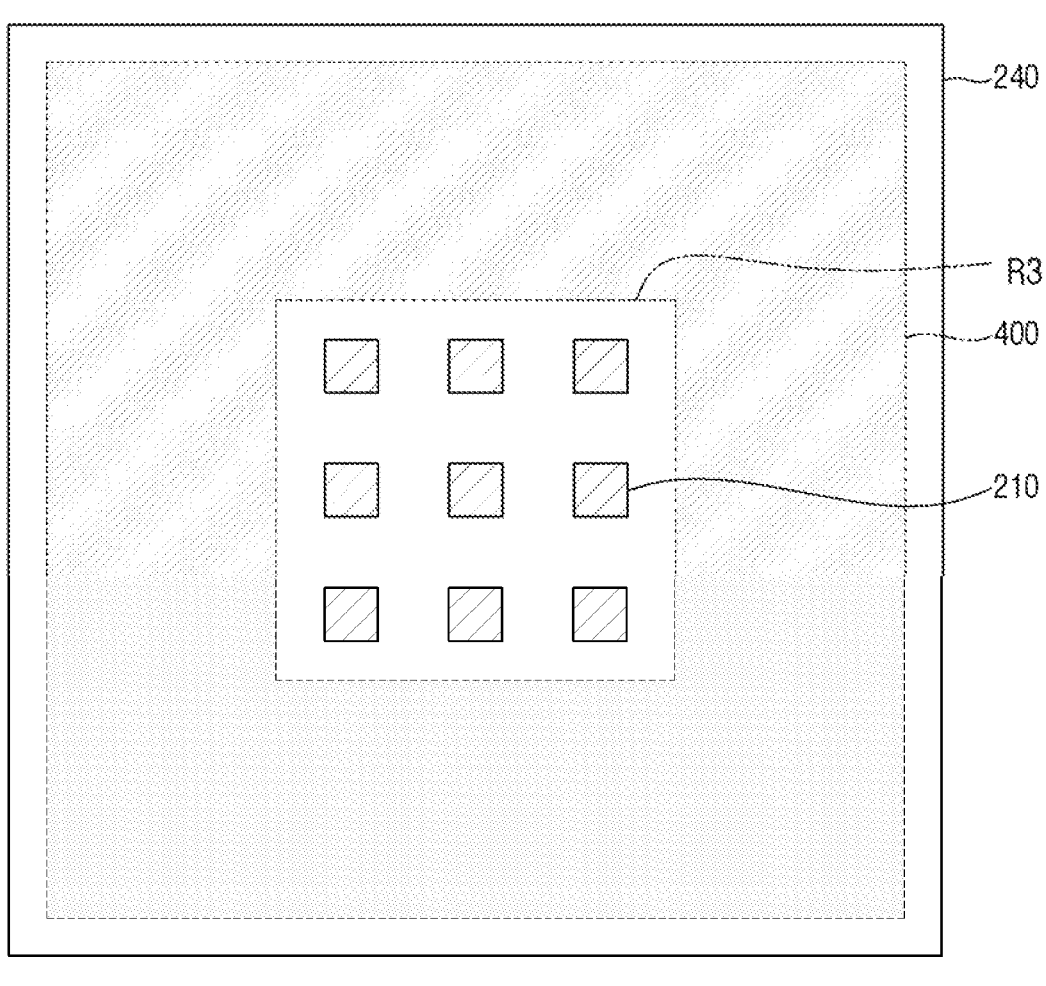
FIG. 4B is a plan view of a top surface of the bottom die of the three-dimensional semiconductor integrated circuit according to one or more example embodiments.
Figure 4B:
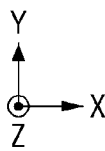
Figure 4C:
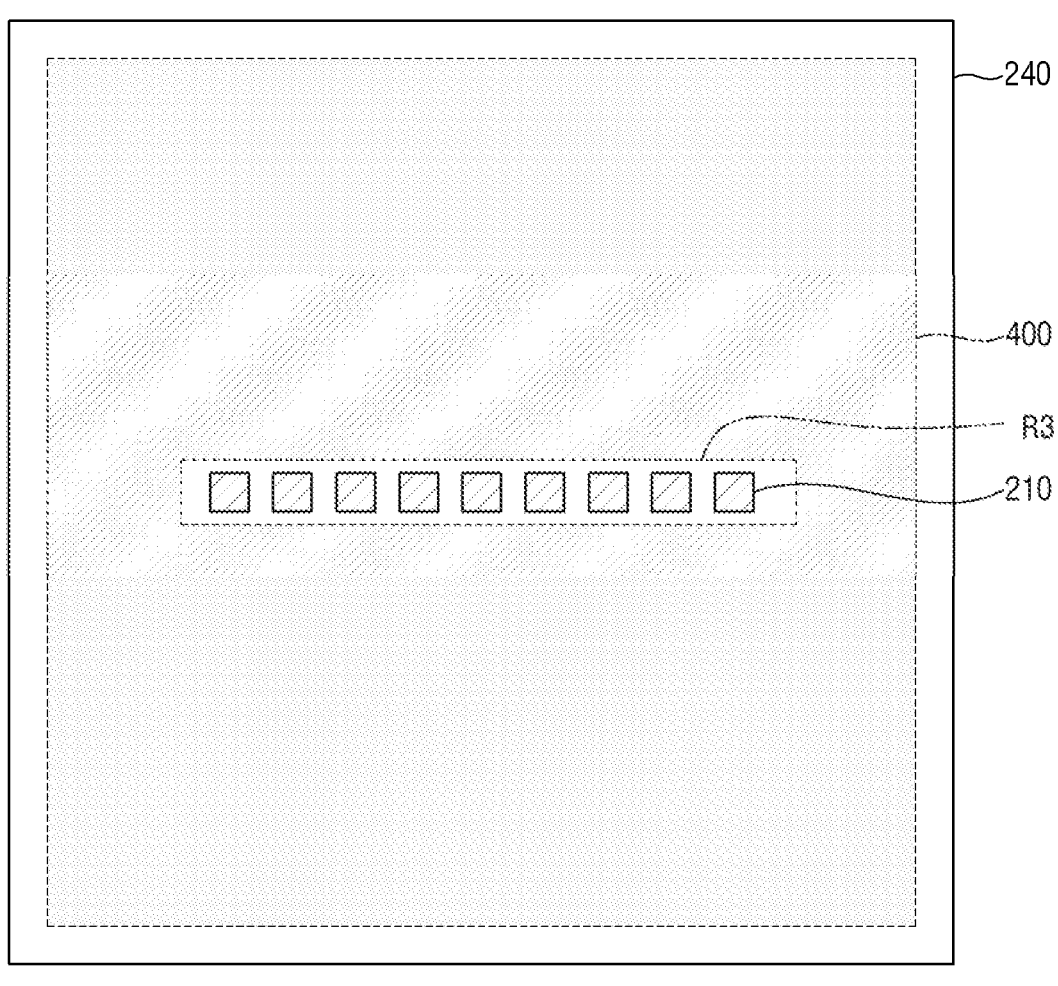
FIG. 4C is a plan view of a top surface of the bottom die of the three-dimensional semiconductor integrated circuit according to one or more example embodiments.
Figure 4C:
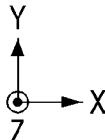

FIG. 4B is a plan view of a top surface of the bottom die of the three-dimensional semiconductor integrated circuit according to one or more example embodiments. FIG. 4C is a plan view of a top surface of the bottom die 200 of the three-dimensional semiconductor integrated circuit according to one or more example embodiments. For convenience, descriptions redundant with the above descriptions are omitted below, and the following descriptions focus on differences from the above descriptions.

According to one or more example embodiments, the macro cells 210 of the bottom-connection region R3 of the bottom die 200 may be provided in various manners. For example, one bottom-connection region R3 including the plurality of macro cells 210 may be provided at any position in a X-Y plane of the bottom die 200. Alternatively, the bottom-connection region R3 according to one or more example embodiments may be divided into a plurality of sub-bottom-connection regions, each including at least one macro cell, wherein the plurality of sub-bottom-connection regions may be individually distributed across the X-Y plane of the bottom die 200. FIG. 4B shows a case in which the bottom-connection region R3 is located at a center of the top surface of the bottom die 200 according to one or more example embodiments.

According to one or more example embodiments, the micro bumps 130 on the top surface of the bottom die 200 may be provided in various forms. FIG. 4B and FIG. 4C illustrate one or more example embodiments in which the micro bumps 130 are provided in a manner corresponding to the manner in which the macro cells 210 of the bottom die 200 are provided.

Referring to FIG. 4B and FIG. 4C, according to one or more example embodiments, the bottom-connection region R3 may be located at a center of the top surface of the bottom die 200. The bottom-connection region R3 may include the plurality of macro cells 210 provided in rows and columns. Each of the macro cells 210 may independently receive different signals. The macro cells 210 may be provided in a plurality of rows and columns provided in the X and Y directions. According to one or more example embodiments, adjacent ones of the macro cells 210 may be spaced apart from each other by a third spacing in the row direction and may be spaced apart from each other by a fourth spacing in the column direction. According to one or more example embodiments, the third spacing and the fourth spacing may be equal to each other. The macro cells 210 may be larger unit-size than the microcells 115. That is, a length of the macro cells 210 in each of the X direction and the Y direction may be greater than that of the micro cells 115 in each of the X direction and the Y direction. The macro cells 210 may have a length in each of the X and Y directions equal to or greater than a diameter of the micro bumps 130. Each of the third spacing and the fourth spacing may be equal to a spacing between adjacent ones of the micro bumps 130, that is, a micro-bump pitch.

The lower-connection region R2 of the top die 100 may be positioned at a position corresponding to that of the bottom-connection region R3. That is, the lower-connection region R2 may be located at a center of the bottom surface of the top die 100. The lower-connection region R2 may include the plurality of micro bumps 130 provided in rows and columns. The micro bumps 130 may have a diameter smaller than or equal to each of the length in the X direction and the length in the Y direction of the macro cells 210.

The logic cell region 400 may be the remaining region other than the bottom-connection region R3.

According to one or more example embodiments, each of the lower-connection region R2 of the top die 100 and the bottom-connection region R3 of the bottom die 200 may have a same arrangement as that of the top-connection region R1. For example, the micro cells 115 in the top-connection region R1 may be provided in a 3×3 tile form as shown in FIG. 4A, the micro bumps 130 in the lower-connection region R2 may be provided in a 3×3 tile form and the macro cells 210 in the bottom-connection region R3 may be provided in a 3×3 tile form as shown in FIG. 4B. In this case, the micro bumps 130 may be spaced apart from each other by a third spacing in the row direction and may be spaced apart from each other by a fourth spacing in the column direction. According to one or more example embodiments, the third spacing and the fourth spacing may be equal to each other. However, each of the third spacing and the fourth spacing may be larger than each of the first spacing and the second spacing between the micro cells 115.

According to one or more example embodiments, each of the lower-connection region R2 of the top die 100 and the bottom-connection region R3 of the bottom die 200 may have a different arrangement from that of the top-connection region R1. For example, the micro cells 115 in the top-connection region R1 may be provided in a 3×3 tile form as shown in FIG. 4A, the micro bumps 130 in the lower-connection region R2 may be provided in a 1×9 tile form and the macro cells 210 in the bottom-connection region R3 may be provided in a 1×9 tile form as shown in FIG. 4C. Alternatively, in one or more example embodiments, the micro bumps 130 and the macro cells 210 may be grouped so that the micro bumps 130 of a first group are spaced from each other by a first spacing and the macro cells 210 of the first group are spaced from each other by the first spacing, while the micro bumps 130 of a second group are spaced from each other by a second spacing and the macro cells 210 of the second group are spaced from each other by the second spacing. In this case, the template pattern may be configured such that the first group may act as an interface for the general-purpose signal and the second group may act as an interface for the local signal.

Figure 5A:
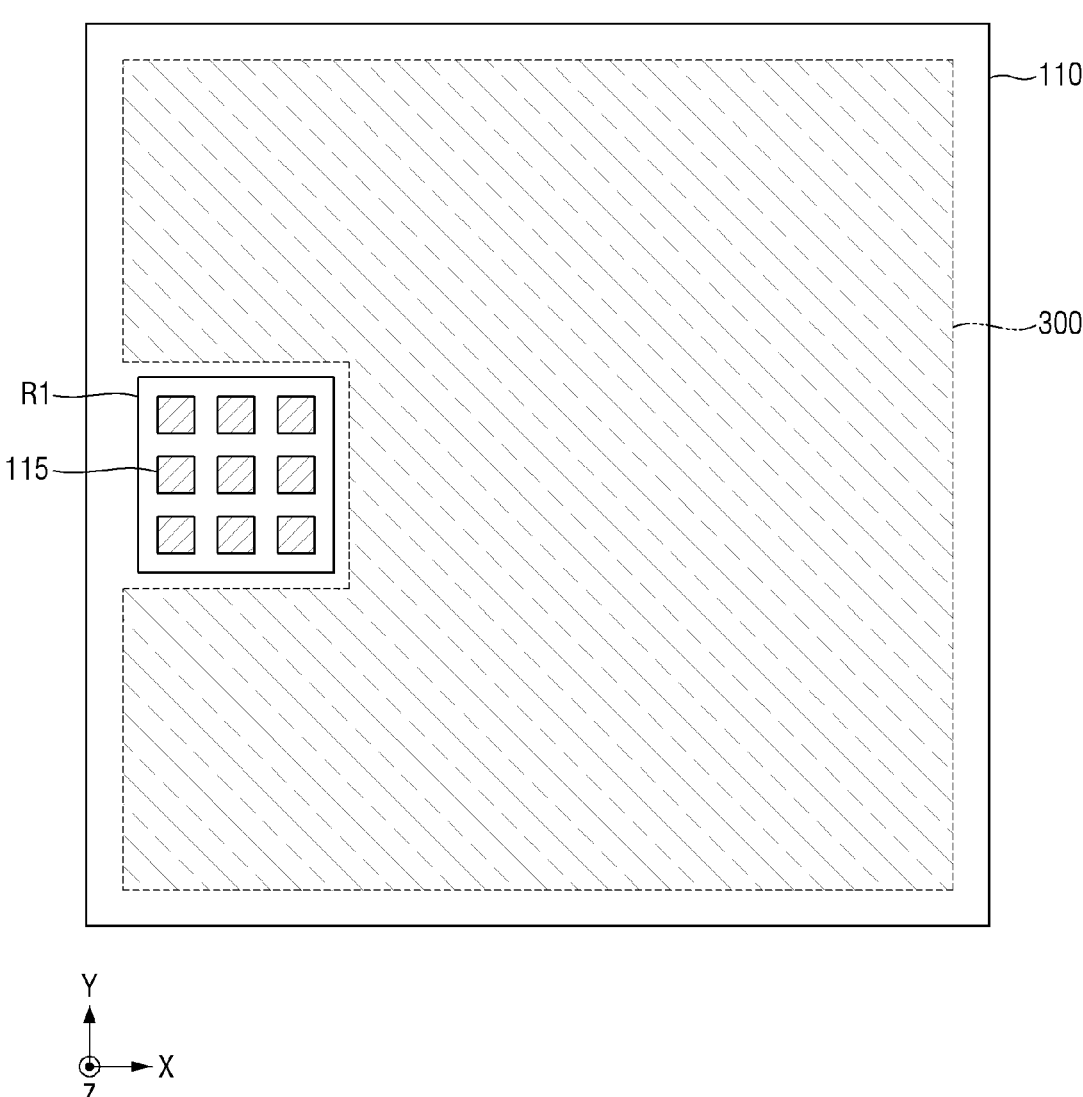
FIG. 5A is a plan view of a top die of a three-dimensional semiconductor integrated circuit according to one or more example embodiments.

FIG. 5A is a plan view of a top die of a three-dimensional semiconductor integrated circuit according to one or more example embodiments. Referring to FIG. 5A, according to one or more example embodiments, the top-connection region R1 may be located in one side region of the top surface of the top die 100. The top-connection region R1 may include the plurality of micro cells 115 provided in rows and columns. Each of the micro cells 115 may independently receive different signals. The micro cells 115 may be provided in a plurality of rows and columns provided in the X and Y directions. According to one or more example embodiments, adjacent ones of the micro cells 115 may be spaced apart from each other by a first spacing in the row direction and may be spaced apart from each other by a second spacing in the column direction. According to one or more example embodiments, the first spacing and the second spacing may be equal to each other.

In one or more example embodiments shown in FIG. 5A, a case in which the micro cells 115 are provided in a 3×3 arrangement is described. However, according to one or more example embodiments, the micro cells 115 may be provided in one row or one column. According to one or more example embodiments, the micro cells 115 may be provided in another matrix form. In addition, although one or more example embodiments have been described based on a case in which there are 9 micro cells 115, the number of micro cells 115 may vary according to various example embodiments.

The logic cell region 300 may be the remaining region other than the top-connection region R1. Unlike one or more example embodiments of FIG. 4A, the top-connection region R1 may be located in one side region of the top die 100, such that a degree of freedom in designing a layout of the logic cells may be increased.

Figure 5B:
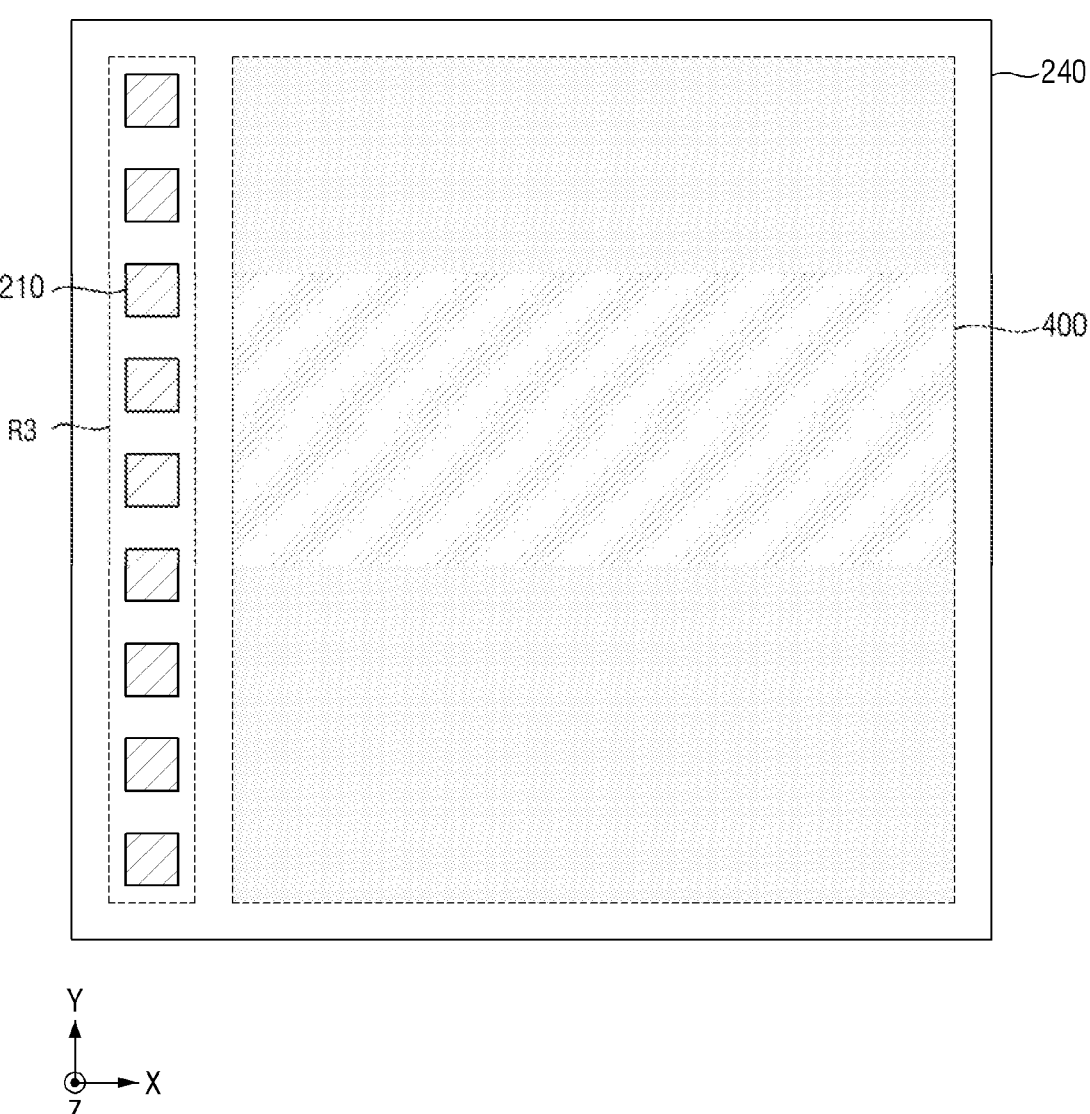
FIG. 5B is a plan view of the bottom die of the three-dimensional semiconductor integrated circuit according to one or more example embodiments.

FIG. 5B is a plan view of the bottom die of the three-dimensional semiconductor integrated circuit according to one or more example embodiments. An arrangement of the micro bumps 130 on the bottom surface of the top die 100 corresponds to an arrangement of the macro cells 210 on the top surface of the bottom die 200. Thus, an arrangement of the macro cells 210 of the bottom die 200 will be described below.

According to one or more example embodiments, the bottom-connection region R3 may be located in one side region of the bottom surface of the top die 100. The bottom-connection region R3 may include a plurality of macro cells 210 provided in rows and columns. Each of the macro cells 210 may independently receive different signals. As shown in FIG. 5B, according to one or more example embodiments, the macro cells 210 in the bottom-connection region R3 may be provided in a matrix form different from that in which the micro cells 115 are provided according to one or more example embodiments shown in FIG. 5A.

For example, the micro cells 115 in the top-connection region R1 may be provided in a 3×3 tile manner as shown in FIG. 5A, while the micro bumps 130 in the lower-connection region R2 may be provided in a line, for example, in a 1×9 tile manner as shown in FIG. 5B, and the macro cells 210 in the bottom-connection region R3 may be provided in a line, for example, in a 1×9 tile manner as shown in FIG. 5B. In one or more example embodiments, the micro bumps 130 and the macro cells 210 may be grouped so that the micro bumps 130 of a first group are spaced from each other by a first spacing and the macro cells 210 of the first group are spaced from each other by the first spacing, while the micro bumps 130 of a second group are spaced from each other by a second spacing and the macro cells 210 of the second group are spaced from each other by the second spacing. In this case, the template pattern may be configured such that the first group may act as an interface for the general-purpose signal and the second group may act as an interface for the local signal.

Alternatively, according to one or more example embodiments, each of the lower-connection region R2 and the bottom-connection region R3 may have the same arrangement as that of the micro cells 115 of FIG. 5A. However, the micro bumps 130 may be spaced apart from each other by a third spacing in the row direction and may be spaced apart from each other by a fourth spacing in the column direction, and the macro cells 210 may be spaced apart from each other by the third spacing in the row direction and may be spaced apart from each other by the fourth spacing in the column direction. According to one or more example embodiments, the third spacing and the fourth spacing may be equal to each other. However, each of the third spacing and the fourth spacing is larger than each of the first spacing and the second spacing between the micro cells 115.

The three-dimensional semiconductor integrated circuit 10 according to the present embodiments has a standardized template pattern as the bus interface between the top die 100 and the bottom die 200, thereby reducing design complexity and allowing the PnR (Place and Routing) in each die to be performed efficiently. In addition, the top-connection region of the top die has a smaller size than that of the lower-connection region of the top die, so that the area overhead of the bus interface may be reduced, and thus a larger number of the logic cells may be integrated in the top surface of the top die.

Although example embodiments have been described above with reference to the accompanying drawings, embodiments of the present disclosure are not limited to the above-described example embodiments and may be implemented in various different forms. It will be apparent to those of ordinary skill in the art that the present disclosure may be implemented in other specific forms without departing from the spirit and scope of the following claims. Therefore, it should be understood that the example embodiments described above are not restrictive but are instead illustrative in all respects.

What is claimed is:

1. A three-dimensional semiconductor integrated circuit device comprising:
   a top die comprising:
      a plurality of micro cells provided on a first side of the top die;
      a plurality of micro bumps provided on a second side of the top die; and
      wiring patterns connecting the plurality of micro cells to the plurality of micro bumps; and
   a bottom die comprising a plurality of macro cells provided on a first side of the bottom die,
   wherein the plurality of macro cells are electrically connected to the plurality of micro bumps, and
   wherein a size of a region comprising the plurality of micro cells is smaller than a size of a region comprising the plurality of micro bumps.

2. The three-dimensional semiconductor integrated circuit device of claim 1, wherein a size of each micro cell of the plurality of micro cells is smaller than a size of the plurality of macro cells.

3. The three-dimensional semiconductor integrated circuit device of claim 2, wherein a spacing between adjacent micro cells of the plurality of micro cells is shorter than a spacing between adjacent micro bumps of the plurality of micro bumps.

4. The three-dimensional semiconductor integrated circuit device of claim 1, wherein an arrangement of the plurality of micro cells corresponds to an arrangement of the plurality of micro bumps.

5. The three-dimensional semiconductor integrated circuit device of claim 1, wherein an arrangement of the plurality of micro bumps is different from an arrangement of the plurality of micro cells.

6. The three-dimensional semiconductor integrated circuit device of claim 1, wherein an arrangement of the plurality of micro bumps corresponds to an arrangement of the plurality of macro cells.

7. The three-dimensional semiconductor integrated circuit device of claim 1, wherein the plurality of micro cells are respectively connected to the plurality of micro bumps, and wherein the plurality of micro cells are configured to transmit and receive different signals, respectively.

8. The three-dimensional semiconductor integrated circuit device of claim 7, wherein the wiring patterns connecting the plurality of micro cells to the plurality of micro bumps comprise a shield structure.

9. The three-dimensional semiconductor integrated circuit device of claim 1, wherein each micro cell of the plurality of micro cells comprises a re-timer.

10. The three-dimensional semiconductor integrated circuit device of claim 9, wherein a number of the re-timers connected to each micro cell of the plurality of micro cells corresponds to a length of a wiring path connected to each micro cell of the plurality of micro cells.

11. A three-dimensional semiconductor integrated circuit device comprising:
a bottom die;
a top die stacked vertically on the bottom die; and
a template pattern configured as an interface for transmitting and receiving a signal between the top die and the bottom die,
wherein the top die comprises micro bumps provided on a bottom surface of the top die, and micro cells provided on a top surface of the top die, and
wherein the micro bumps and the micro cells are respectively connected to each other via a wiring pattern in a tree structure manner.

12. The three-dimensional semiconductor integrated circuit device of claim 11, wherein the three-dimensional semiconductor integrated circuit device is configured to place the template pattern in the top die and the bottom die, and then place a logic cell in each of the top die and the bottom die.

13. The three-dimensional semiconductor integrated circuit device of claim 11, wherein the template pattern comprises:
a top-connection region comprising the micro cells provided on the top surface of the top die;
a lower-connection region comprising the micro bumps provided on the bottom surface of the top die; and
the wiring pattern connecting the micro cells and the micro bumps to each other, respectively.

14. The three-dimensional semiconductor integrated circuit device of claim 13, wherein a size of the top-connection region is smaller than a size of the lower-connection region.

15. The three-dimensional semiconductor integrated circuit device of claim 14, wherein a spacing between adjacent micro cells of the micro cells is shorter than a spacing between adjacent micro bumps of the micro bumps.

16. The three-dimensional semiconductor integrated circuit device of claim 14, wherein a size of each micro cell of the micro cells is smaller than a size of each micro bump of the micro bumps.

17. The three-dimensional semiconductor integrated circuit device of claim 13, wherein the wiring pattern further comprises a shield structure.

18. The three-dimensional semiconductor integrated circuit device of claim 11, wherein the bottom die comprises a plurality of macro cells provided on a top surface of the bottom die, and
wherein the micro bumps are provided at positions corresponding to the plurality of macro cells, respectively.

19. A three-dimensional semiconductor integrated circuit device comprising:
a top die comprising:
a top-connection region comprising a plurality of micro cells on a top surface of the top die;
a lower-connection region comprising a plurality of micro bumps on a bottom surface of the top die; and
a wiring pattern connecting the plurality of micro cells to the plurality of micro bumps; and
a bottom die stacked under the top die,
wherein the bottom die comprises a bottom-connection region comprising a plurality of macro cells on a top surface of the bottom die, and
wherein a size of the top-connection region is smaller than a size of the lower-connection region.

20. The three-dimensional semiconductor integrated circuit device of claim 19, wherein the top die comprises:
a logic cell provided in a remaining region other than the top-connection region on the top surface of the top die, and
wherein the logic cell is connected to the plurality of micro cells via the wiring pattern.

* * * * *